(12) United States Patent
Hong et al.

(10) Patent No.: US 8,394,697 B2
(45) Date of Patent: Mar. 12, 2013

(54) METHODS OF FORMING CAPACITORS FOR SEMICONDUCTOR MEMORY DEVICES

(75) Inventors: Jong-Seo Hong, Gyeonggi-do (KR); Jeong-Sic Jeon, Gyeonggi-do (KR); Chun-Suk Suh, Gyeonggi-do (KR); Yoo-Sang Hwang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 3 days.

(21) Appl. No.: 13/010,297

(22) Filed: Jan. 20, 2011

(65) Prior Publication Data

US 2011/0117715 A1 May 19, 2011

Related U.S. Application Data

(62) Division of application No. 11/316,166, filed on Dec. 22, 2005, now Pat. No. 7,888,724.

(30) Foreign Application Priority Data

Dec. 24, 2004 (KR) .................. 10-2004-0112213

(51) Int. Cl.
*H01L 27/108* (2006.01)

(52) U.S. Cl. ........ 438/253; 438/396; 438/622; 438/672; 257/E21.538; 257/E21.627

(58) Field of Classification Search .................. 257/238, 257/239, 240, 253, 254, 255, 256, 308, 381, 257/396, 397, 398, 399, E27.088, E27.089, 257/E21.649, E21.627, E21.537, E21.538; 438/254, 397, 618, 622, 253, 381, 396, 584, 438/637, 638, 672, FOR. 395
See application file for complete search history.

(56) References Cited

U.S. PATENT DOCUMENTS

| | | | | |
|---|---|---|---|---|
| 6,204,161 | B1 * | 3/2001 | Chung et al. | 438/612 |
| 6,294,426 | B1 | 9/2001 | Tu et al. | 438/255 |
| 6,929,999 | B2 | 8/2005 | Park et al. | 438/253 |
| 7,180,118 | B2 * | 2/2007 | Cho et al. | 257/306 |
| 2003/0215983 | A1 * | 11/2003 | Bae et al. | 438/118 |
| 2004/0058496 | A1 * | 3/2004 | Lee | 438/258 |
| 2004/0147114 | A1 * | 7/2004 | Park et al. | 438/666 |
| 2006/0205141 | A1 * | 9/2006 | Park et al. | 438/239 |
| 2009/0315143 | A1 * | 12/2009 | Jung et al. | 257/532 |

FOREIGN PATENT DOCUMENTS

| | | |
|---|---|---|
| KR | 1020040011993 A | 2/2004 |
| KR | 1020040050535 A | 6/2004 |
| KR | 1020040059964 A | 7/2004 |

* cited by examiner

*Primary Examiner* — Olik Chaudhuri
*Assistant Examiner* — Quovaunda V Jefferson
(74) *Attorney, Agent, or Firm* — Myers Bigel Sibley & Sajovec (57) ABSTRACT

A capacitor of a semiconductor memory device, and methods of forming the same, are disclosed. A pad interlayer insulating layer is disposed on a semiconductor substrate of an active region. Landing pads and a central landing pad are disposed in peripheral portions and a central portion of the active region, respectively, to penetrate the pad interlayer insulating layer. The upper surface of the central landing pad has a different area from the upper surfaces of the landing pads. A buried interlayer insulating layer is formed on the pad interlayer insulating layer to cover the landing pads and the central landing pad. Buried plugs are formed on the respective landing pads to penetrate the buried interlayer insulating layer. Lower electrodes are formed on the buried plugs.

20 Claims, 11 Drawing Sheets

METHODS OF FORMING CAPACITORS FOR SEMICONDUCTOR MEMORY DEVICES

CROSS-REFERENCE TO RELATED APPLICATION

This application is a divisional of U.S. patent application Ser. No. 11/316,166 filed Dec. 22, 2005 which claims priority from Korean Patent Application No. 10-2004-0112213, filed on Dec. 24, 2004, now U.S. Pat. No. 7,888,724, the disclosures of which are hereby incorporated herein by reference in their entireties as if set forth fully herein.

FIELD OF INVENTION

The present invention relates to discrete elements of a semiconductor device and methods of forming the same, and more particularly, to capacitors for semiconductor memory devices and methods of forming the same.

BACKGROUND

As the design rule for DRAM capacitors has been scaled down to below submicron dimensions, many efforts have been made to reduce electrical short circuiting (shorting) of lower electrodes and to more effectively arrange lower electrodes within an area on a semiconductor substrate. An electrical short of a lower electrode of a capacitor may occur when photolithography and etch processes of a semiconductor fabrication process are pushed to the limits of allowable process margins. Further, an electrical short of a lower electrode may occur because surface areas of the lower electrodes may be maintained the same size in order to maintain the capacitance of capacitors, even as the design rule is decreased. To do so, there has been proposed a method of placing conductive layer patterns below respective lower electrodes, in order to use upper spaces on a semiconductor substrate more effectively. The conductive layer patterns may be covered with the same interlayer insulating layer as the lower electrodes. Further, the conductive layer patterns may allow the lower electrodes to be electrically connected to the semiconductor substrate.

However, while providing conductive layer patterns on the semiconductor substrate may reduce the occurrence of electrical shorts of the lower electrodes, such a DRAM device may not have good electrical characteristics due to the conductive layer patterns. This is because electrical shorts of the conductive layer patterns may occur when a scaled-down design rule is used. An electrical short of the conductive layer patterns may deteriorate the electrical characteristics of a DRAM capacitor.

A method of forming a capacitor is disclosed in U.S. Pat. No. 6,294,426 entitled "Method Of Fabricating A Capacitor Under Bit Line Structure With Increased Capacitance Without Increasing The Aspect Ratio For A Dry Etched Bit Line Contact Hole" to Kuo-Chi Tu, et. al.

According to Kuo-Chi Tu, et. al, the method includes sequentially forming transfer gate transistors, capacitor structures and a bit line structure on a semiconductor substrate. Conductive plugs are formed between the bit line structure and the semiconductor substrate and between the capacitor structures and the semiconductor substrate respectively. At this time, the conductive plugs disposed between the capacitor structures and the semiconductor substrate have heights lower than those of the conductive plugs between the bit line structure and the semiconductor substrate. The method provides a way of increasing the capacitance of a capacitor by increasing the areas of lower electrodes, using the height difference of the conductive plugs.

However, the method described by Kuo-Chi Tu et al. may have a limited ability to increase the capacitance of a capacitor in semiconductor fabrication processes having a submicron design rule. This is because the lower electrodes are related to the height of the bit line structure in a CUB (capacitor under a bit line) structure. Further, since the bit line structure exists between the lower electrodes, there may be a very small allowance margin in the semiconductor fabrication processes to prevent electrical shorts of the lower electrodes.

SUMMARY OF THE INVENTION

Some embodiments of the present invention may provide capacitors of a DRAM semiconductor memory device capable of effectively using a given region of a semiconductor substrate by sequentially stacking landing pads, buried plugs and lower electrodes.

In accordance with some embodiments of the invention, a capacitor of a semiconductor memory device includes an active region disposed in a semiconductor substrate. The active region extends in a longitudinal direction along a centerline thereof. A pair of landing pads are disposed respectively in peripheral portions of the active region and are spaced apart along the longitudinal direction. A central landing pad is disposed in a central portion of the active region, and a pair of buried plugs are disposed respectively on the pair of landing pads. Each of the buried plugs has a central axis therethrough that is offset from a longitudinal centerline of the active region along different directions. A pair of lower electrodes is disposed respectively on the buried plugs, such that each of the lower electrodes overlaps one of the landing pads. Each of the landing pads includes an upper surface having an area that is larger than an area of an upper surface of the central landing pad.

In accordance with further embodiments of the present invention, a capacitor of a semiconductor memory device includes at least two active regions disposed in a semiconductor substrate. Respective pairs of landing pads are disposed on peripheral portions of the active regions and are spaced apart along longitudinal directions of the active regions. Central landing pads are disposed in central portions of the active regions, and buried plugs are in contact with the landing pads and offset toward different directions from longitudinal centerlines of the respective active regions. Lower electrodes are disposed on respective buried plugs, and the lower electrodes, the buried plugs, and the landing pads each have different central axes respectively. Each of the lower electrodes overlaps a landing pad, and the landing pads have upper surfaces that are larger than areas of upper surfaces of the central landing pads.

Some embodiments of the present invention provide methods of forming a capacitor of a semiconductor memory device including forming a pad interlayer insulating layer on an active region of a semiconductor substrate. Landing pads and a central landing pad are formed in peripheral portions and a central portion of the active region respectively to penetrate the pad interlayer insulating layer. An upper surface of the central landing pad has different area size from those of upper surfaces of the landing pads. A buried interlayer insulating layer is formed on the pad interlayer insulating layer to cover the landing pads and the central landing pad. Buried plugs are formed on the landing pads respectively to penetrate the buried interlayer insulating layer. Lower electrodes are formed on the buried plugs respectively. The lower electrodes and the buried plugs are formed to be spaced from central axes of the landing pads and to cross with each other and overlap. The lower electrodes are formed to overlap one of the landing pads sufficiently.

In accordance with further embodiments of the present invention, methods of forming a capacitor of a DRAM include forming a pad interlayer insulating layer on a semiconductor substrate having at least two active regions disposed therein. Landing pads and central landing pads are disposed in peripheral portions and central portions of the active regions respectively to penetrate the pad interlayer insulating layer. Upper surfaces of the central landing pads have different area size from those of upper surfaces of the landing pads. A buried interlayer insulating layer is formed on the pad interlayer insulating layer to cover the landing pads and the central landing pads. Buried plugs are formed on the landing pads to penetrate the buried interlayer insulating layer. Lower electrodes are formed on the buried plugs respectively. The lower electrodes and the buried plugs are disposed to be spaced from the central axes of the landing pads and to cross with each other and overlap. The lower electrodes are disposed to overlap two of the landing pads sufficiently.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

It also will be understood that, as used herein, the terms "row" and "column" indicate two non-parallel directions that may be orthogonal to one another. However, the terms row and column do not indicate a particular horizontal or vertical orientation.

Figure 1:
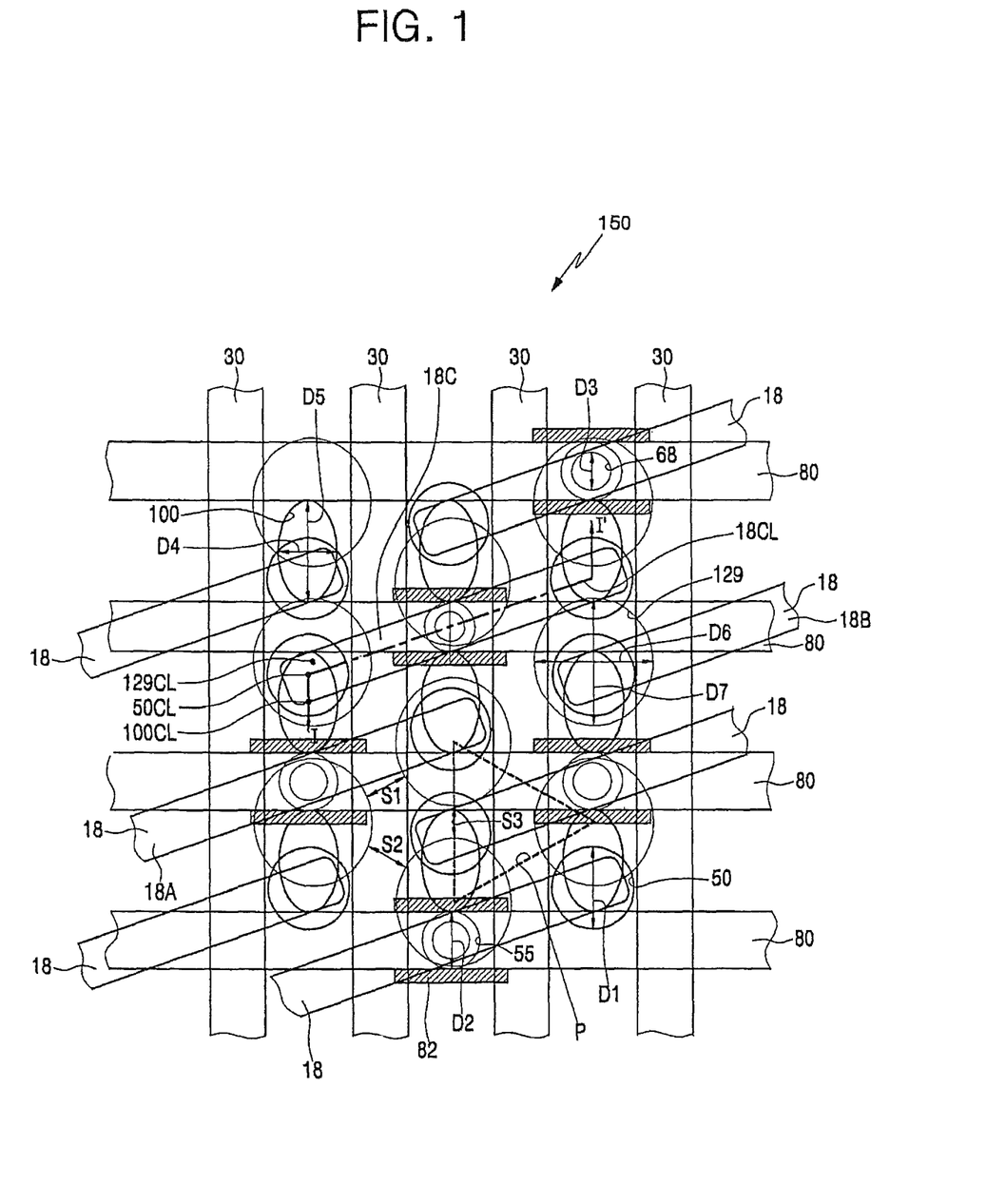
FIG. 1 is a layout illustrating a DRAM semiconductor memory device according to some embodiments of the present invention.
Figure 2:
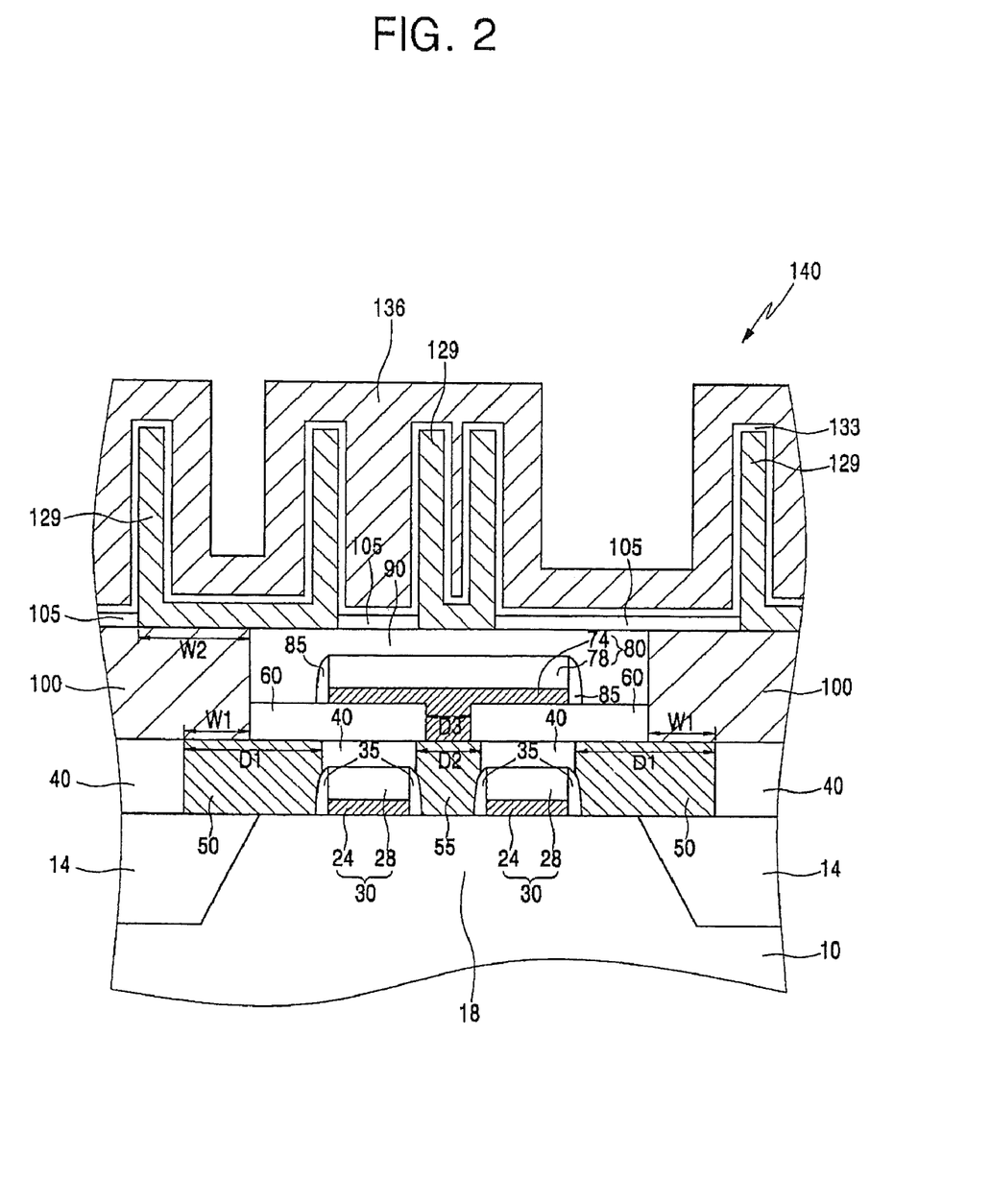
FIG. 2 is a sectional view illustrating capacitors of a DRAM semiconductor memory device according to some embodiments of the invention taken along line I-I' of FIG. 1.

FIG. 1 is a layout illustrating a DRAM semiconductor memory device 150 in plan view according to some embodiments of the present invention. FIG. 2 is a sectional view illustrating capacitors of the DRAM device 150 taken along line I-I' of FIG. 1.

Referring to FIGS. 1 and 2, a plurality of active regions 18 are disposed in a semiconductor substrate 10. The active regions 18 are defined by an isolation layer 14 disposed in the semiconductor substrate 10. The isolation layer 14 may be formed of an insulating layer having a different etch rate from that of the semiconductor substrate 10. A layout of one of the active regions 18 may rotated 180 degrees to become a layout of a neighboring active region in the longitudinal direction. For example, the layout pattern of the active region 18A is the same as the layout pattern of the neighboring active region 18B in the longitudinal direction, except that it is rotated by 180°. Landing pads 50 and central landing pads 55 are disposed on the lines extending along a longitudinal direction of the active regions 18. The central landing pads 55 and the landing pads 50 may be disposed on the central portions and the peripheral portions of the active regions 18, respectively. The upper surfaces of the landing pads 50 and the central landing pads 55 may have circular shapes. The upper surfaces of the central landing pads 55 may have smaller area sizes than those of the landing pads 50. The upper surface of the landing pads 50 has a predetermined diameter D1. The upper surface of the central landing pads 55 has a predetermined diameter D2 different from the diameter D1 of the landing pad 50. The landing pads 50 and the central landing pads 55 may be formed of, for example, N+-type polysilicon.

Buried plugs 100 are disposed to contact the landing pads 50 respectively. The buried plugs 100 are separated from each other along the longitudinal direction of one active region 18. The buried plugs 100 may be offset from the respective landing pads 50. That is, referring to FIG. 1, each of the buried plugs 100 may have a central axis 100CL that is displaced from a central axis 50CL of a respective landing pad 50. Thus, the buried plugs 100 may overlap the landing pads 50 respectively by as much as a width W1. The upper surfaces of the buried plugs 100 may have elliptical shapes. The buried plugs 100 may be formed of N+-type polysilicon.

Lower electrodes 129 are disposed on the buried plugs 100, respectively. The lower electrodes 129 are disposed on the semiconductor substrate 10, and may be spaced from neighboring lower electrodes 129 by the same distances, S1, S2, S3. Accordingly, in the group of three neighboring lower electrodes 129, the points connecting the centers of the three lower electrodes 129 form a triangular shape P. The lower electrodes 129 may be offset from the buried plugs. That is, each lower electrode 129 may have a central axis 129CL that is spaced apart from the central axis passing vertically through a respective buried plug 100 by a predetermined distance. Thus, the lower electrodes 129 may overlap the buried plugs 100 by a predetermined width W2 respectively. As such, the lower electrodes 129, the buried plugs 100 and the landing pads 50 are disposed on the semiconductor substrate 100 with different central axes, respectively, that are offset from each other. Further, the lower electrodes 129 may be disposed to overlap one of the landing pads 50 on one active region 18. The upper surfaces of the lower electrodes 129 may, for example, have elliptical shapes. The lower electrodes 129 may be formed of N+-type polysilicon and/or a metal material, including titanium nitride (TiN).

An etch stop layer 105 surrounding the lower portions of the lower electrodes 129 may be disposed on the semiconductor substrate 10. The etch stop layer 105 may include silicon nitride ($Si_3N_4$). A dielectric layer 133 and an upper electrode 136 may be disposed to cover the lower electrodes 129. The upper electrode 136 may be formed of N+-type polysilicon and/or a metal material including titanium nitride (TiN). The dielectric layer 133 may include aluminum oxide ($Al_2O_3$) and/or titanium nitride (TiN), which may be sequentially stacked. The dielectric layer 133 may include hafnium oxide (HfO), aluminum oxide ($Al_2O_3$) and/or titanium nitride (TiN), which may be sequentially stacked.

Gate patterns 30 may be disposed between the landing pads 50 and the central landing pads 55. The gate patterns 30 are disposed on the semiconductor substrate 10 and run across the active regions 18. Each of the gate patterns 30 may include a gate 24 and a gate capping layer pattern 28, which are sequentially stacked. The gate capping layer pattern 28 may be an insulating layer having the same etch rate as that of the etch stop layer 105. The gate 24 may include N-type polysilicon and/or a metal silicide, which may be sequentially stacked. Preferably, a layout pattern 18A of one of the active regions 18 may be rotated 180 degrees and is shifted in parallel with the bit line patterns of FIG. 1 as much as the width of the one active region to define a layout pattern 18C for another neighboring active region.

Gate spacers 35 may be disposed on the sidewalls of each of the gate patterns 30. The gate spacers 35 may be formed, for example, of an insulating layer having the same etch rate as that of the gate capping layer pattern 28. Pad interlayer insulating layers 40 may be disposed on the gate patterns 30 respectively to surround the landing pads 50 and the central landing pads 55. The pad interlayer insulating layer 40 may include an insulating layer having an etch rate different from that of the gate capping layer patterns 28.

Bit line patterns 80 may be disposed on the pad interlayer insulating layer 40 to run across the active regions 18. The bit line patterns 80 may be disposed in a direction perpendicular to the gate patterns 30 and oblique to the longitudinal direction of the active regions 18. The bit line patterns 80 are disposed below the lower electrodes 129 between the buried plugs 100, so as to contact with the central landing pads 55, respectively. The bit line pattern 80 may include a bit line 74 and a bit line capping layer pattern 78. The bit line capping layer pattern 78 may include an insulating layer having the same etch rate as that of the gate capping layer pattern 28. The bit line 74 may include N-type polysilicon and/or metal silicide, which may be sequentially stacked. The bit line 74 may include a metal material, such as tungsten (W) and/or titanium nitride (TiN), which may be sequentially stacked. The buried plugs 100 and the lower electrodes 129 may have a minor axis and a major axis, respectively, in the longitudinal directions of the bit line patterns 80 and the gate patterns 30. To do so, the upper surface of each of the buried plugs 100 may have a diameter D4 in the longitudinal direction of the bit line pattern 80 and a diameter D5 in the longitudinal direction of the gate pattern 30. Further, the upper surface of each of the lower electrodes 129 may have a diameter D6 in the longitudinal direction of the bit line pattern 80 and a diameter D7 in the longitudinal direction of the gate pattern 30.

Bit line spacers 85 may be disposed on the sidewalls of the bit line pattern 80. A bit line spacer 85 may include an insulating layer having the same etch rate as that of the gate capping layer pattern 28. A planarized interlayer insulating layer 60 and a buried interlayer insulating layer 90 may be sequentially disposed on the semiconductor substrate 10 to cover the bit line patterns 80 and surround the buried plugs 100. The buried interlayer insulating layer 90 and the planarized interlayer insulating layer 60 may be formed of an insulating layer having the same etch rate as that of the pad interlayer insulating layer 40. The bit line patterns 80 may have dummy patterns 82 disposed on the central landing pads 55 respectively.

Therefore, embodiments of the present invention include two capacitors 140 on one active region 18 of the semiconductor substrate 10. Each of the capacitors 140 has a landing pad 50, a buried plug 100 and a lower electrode 129, which are sequentially stacked along respective central axes passing through the active region, with the respective central axes being spaced from each other. As such, the capacitors 140 may include elliptical-shaped buried plugs 100, and the lower electrodes 129 respectively on the semiconductor substrate 10. Such an arrangement may provide an increased process redundancy, which may be important when forming devices using a submicron design rule. Further, since the capacitor 140 has a structure being suitable to reducing electrical shorts of the lower electrodes 129, the electrical characteristics of the device may be improved compared to conventional structures.

FIGS. 3 to 13 are sectional views taken along a line of I-I' of FIG. 1 illustrating operations associated with forming capacitors of a DRAM semiconductor memory device.

Figure 3:
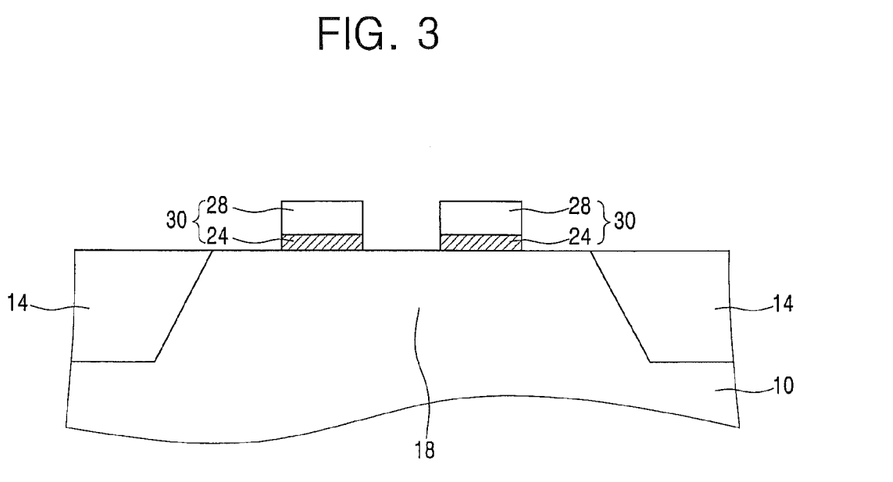
FIGS. 3 to 13 are sectional views illustrating operations associated with forming capacitors of a DRAM semiconductor memory device taken along line I-I' of FIG. 1, respectively.
Figure 4:
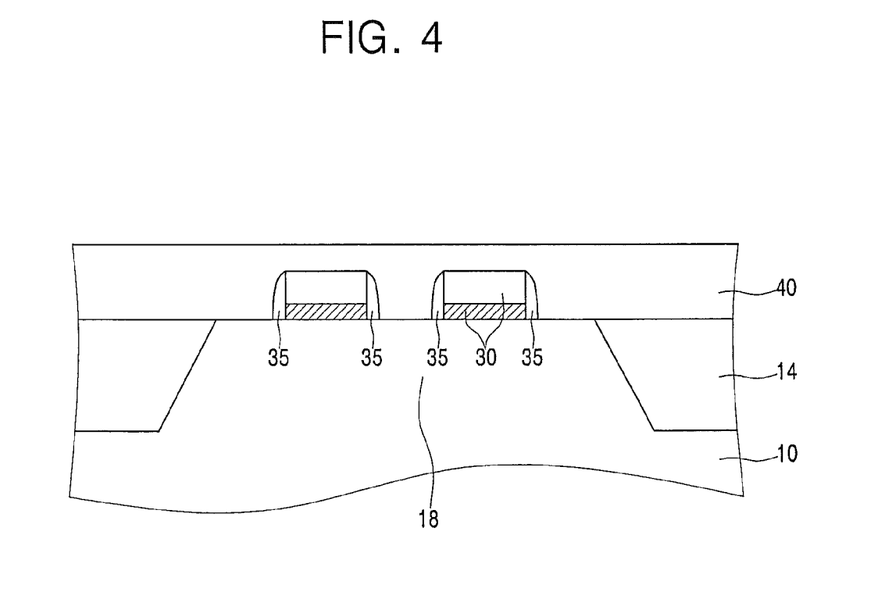

Referring to FIGS. 1, 3 and 4, an isolation layer 14 is formed in a semiconductor substrate 10 inside a cell array region of a DRAM semiconductor memory device 150. The isolation layer 14 may be formed to isolate active regions 18. The isolation layer 14 may be formed using an insulating layer having an etch rate different from that of the semiconductor substrate 10. One of the active regions 18 may serve as the active region for a pair of neighboring cells of the DRAM device 150, which are spaced apart in the longitudinal direction of the active region 18.

Gate patterns 30 are formed to run across over the active regions 18. The gate pattern 30 may be formed using a gate 24 and a gate capping layer pattern 28, which are sequentially stacked. The gate capping layer pattern 28 may be formed using silicon nitride ($Si_3N_4$). The gate 24 may be formed using N-type polysilicon and metal silicide, which are sequentially stacked. One of the active regions 18 may serve as the active region 18 for a pair of neighboring cells of the DRAM device 150, which are spaced apart along the longitudinal direction of the active region 18.

Gate spacers 35 are formed on the sidewalls of each of the gate patterns 30 respectively. The gate spacer 35 may be formed using an insulating layer having the same etch rate as that of the gate capping layer pattern 28. A pad interlayer insulating layer 40 is formed to cover the gate patterns 30. The pad interlayer insulating layer 40 may be formed using an insulating layer having an etch rate different from that of the gate spacer 35.

Figure 5:
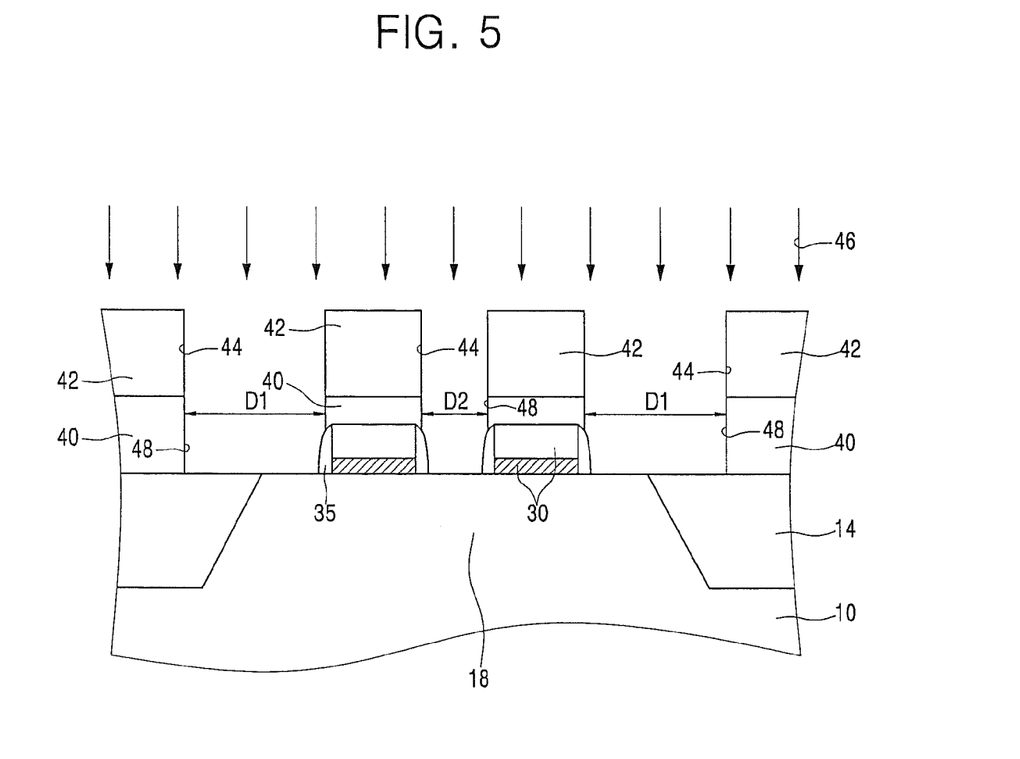
Figure 6:
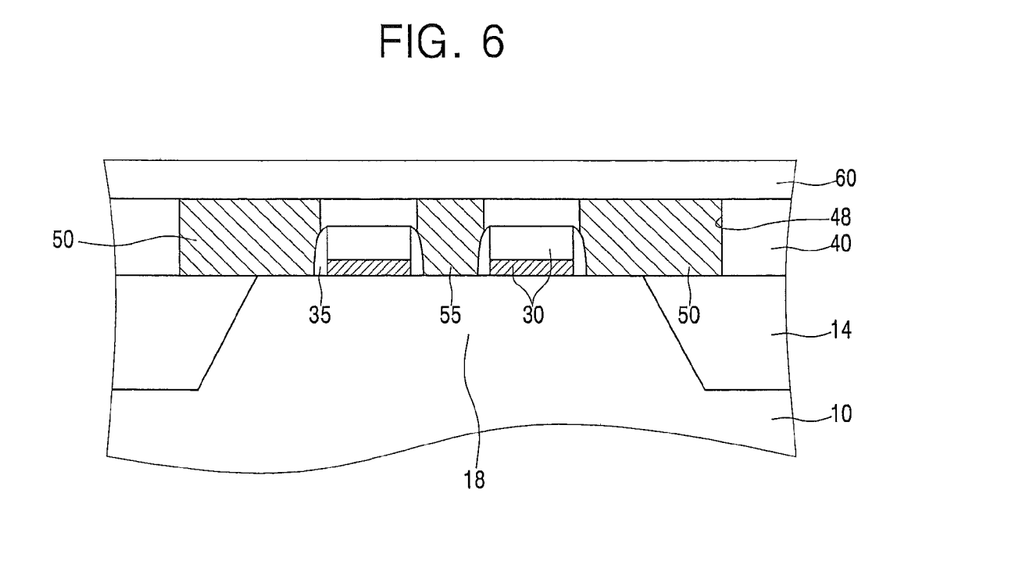

Referring to FIGS. 1, 5 and 6, a photoresist layer 42 is formed on the pad interlayer insulating layer 40. The photoresist layer 42 is formed to have openings 44 on the predetermined portions between the gate patterns 30 respectively. That is, the openings 44 of the photoresist layer 42 may extend along the longitudinal direction of the active regions 18, and may be formed on the edge portions and the central portions of the active regions 18, respectively. The openings 44 of the photoresist layer 42 are formed to have circular shapes. Further, the openings 44 of the photoresist layer 42 may be formed to have different diameters D1, D2 on the edge portions and the central portions of the active regions 18, respectively.

An etch process 46 is performed on the pad interlayer insulating layer 40 through the openings 44 using the photoresist layer 42 as an etch mask. The etch process 46 forms pad holes 48 penetrating the pad interlayer insulating layer 40 and exposing the semiconductor substrate 10. The upper surfaces of the pad holes 48 are formed to have different diameters D1, D2 through the openings 44 on the edge portions and the central portions of the active regions 18. The pad holes 48 on the edge portions of the active regions 18 may be formed to have an area greater than an area of the pad holes 48 on the central portions of the active regions 18. After the pad holes 48 are formed, the photoresist layer 42 may be removed from the semiconductor substrate 10.

Landing pads 50 and central landing pads 55 are formed to fill the pad holes 48 on the edge portions of the active regions 18 and the pad holes 48 on the central portions of the active regions 18, respectively. Thus, the upper surfaces of the central landing pads 55 and the landing pads 50 are formed to have different diameters D1, D2 through the pad holes 48. Thus, the upper surfaces of the landing pads 50 are formed to have different area sizes from those of the upper surfaces of the central landing pads 55. The central landing pads 55 and the landing pads 50 may be formed on the semiconductor substrate 10 with a same height. The landing pads 50 and the central landing pads 55 may be formed using conductive polysilicon. The conductive polysilicon may include N-type impurity ions. A planarized interlayer insulating layer 60 is formed on the pad interlayer insulating layer 40 to cover the central landing pads 55 and the landing pads 50. The planarized interlayer insulating layer 60 may be formed using an insulating layer having the same etch rate as that of the pad interlayer insulating layer 40.

Figure 7:
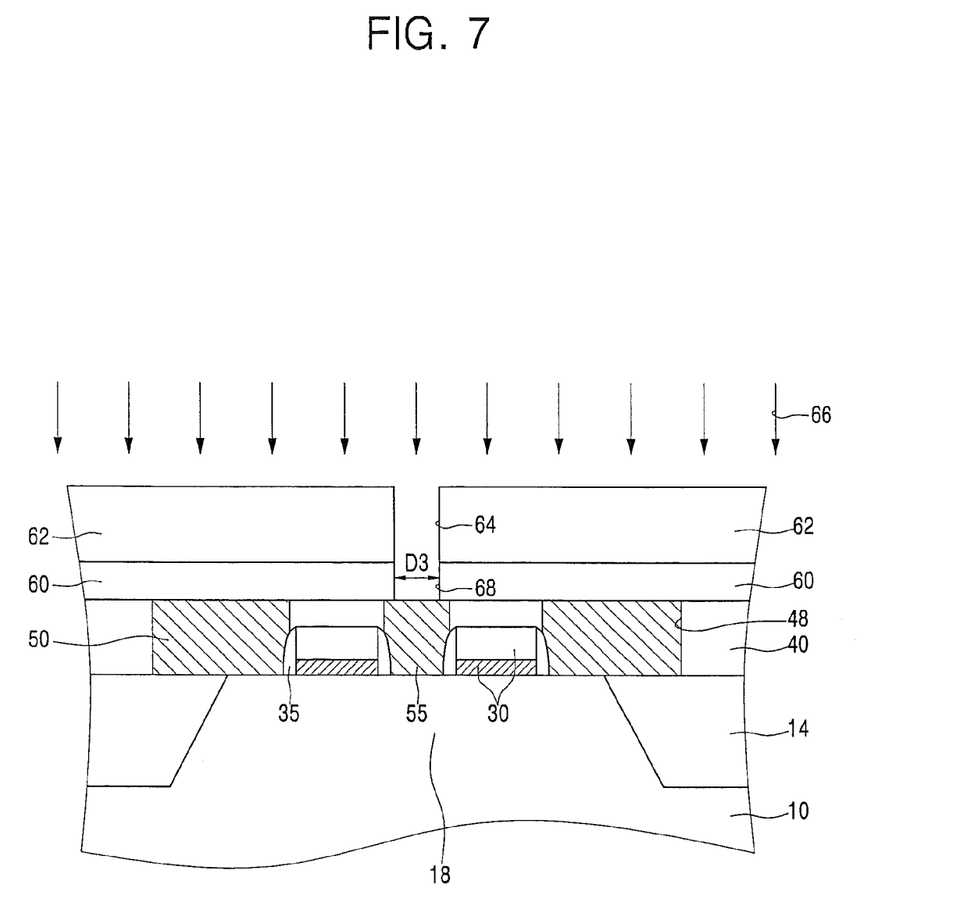
Figure 8:
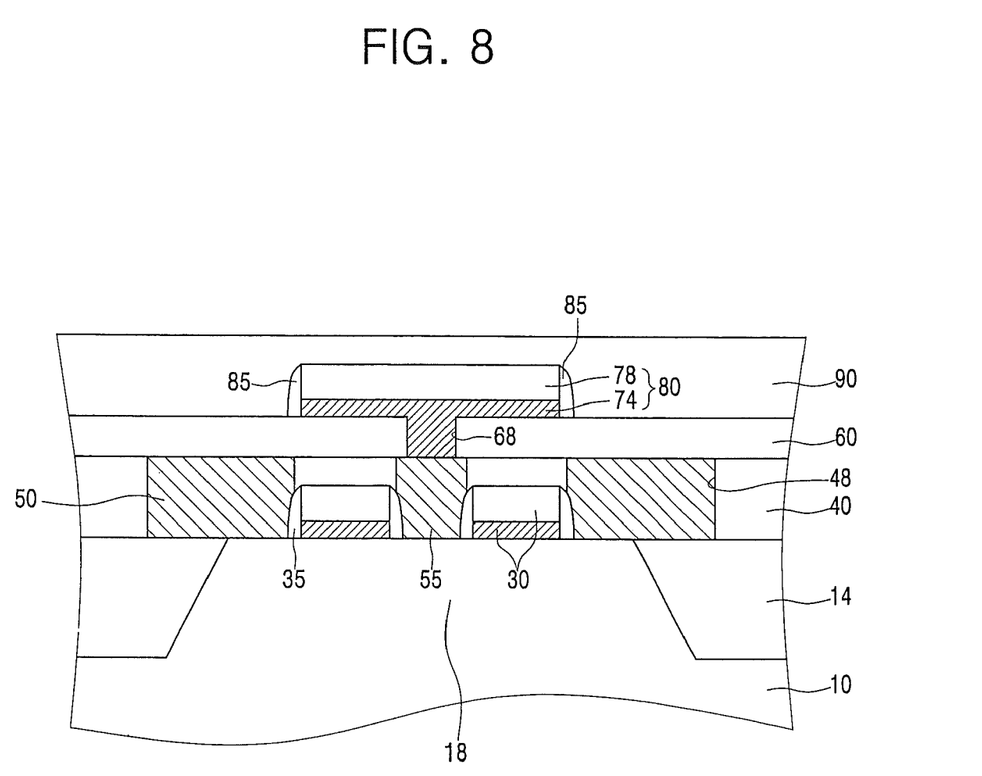

Referring to FIGS. 1, 7 and 8, a photoresist layer 62 is formed on the planarized interlayer insulating layer 60. The photoresist layer 62 is formed to have openings 64 on the central landing pads 55. The openings 64 of the photoresist layer 62 may be formed to have circular shapes. Each of the openings 64 of the photoresist layer 62 may be formed to have a predetermined diameter D3.

An etch process 66 is performed on the planarized interlayer insulating layer 60 through the openings 64, using the photoresist layer 62 as an etch mask. The etch process 66 forms bit line holes 68 penetrating the planarized interlayer insulating layer 60 and exposing the semiconductor substrate 10. The bit line holes 68 may be formed to overlap the central landing pads 55 respectively. After the bit line holes 68 are formed, the photoresist layer 62 may be removed from the semiconductor substrate 10.

Bit line patterns 80 are formed on the planarized interlayer insulating layer 60 to fill the bit line holes 68 respectively. The bit line patterns 80 are formed perpendicular to the longitudinal direction of the gate patterns 30. Further, the bit line patterns 80 are formed to pass over portions of the active regions 18 between the landing pads 50. Each of the bit line patterns 80 is formed using a bit line 74 and a bit line capping layer pattern 78, which may be sequentially stacked. The bit line capping layer pattern 78 may be formed to have the same etch rate as that of the gate spacer 35. The bit line 74 may be formed using N-type polysilicon and/or a metal silicide, which may be sequentially stacked. The bit line 74 may be formed using a metal material including tungsten (W) and/or titanium nitride (TiN), which may be sequentially stacked.

Bit line spacers 85 are formed on the sidewalls of each of the bit line patterns 80. The bit line spacers 85 may be formed to have the same etch rate as that of the bit line capping layer pattern 78. A buried interlayer insulating layer 90 is formed on the planarized interlayer insulating layer 60 to cover the bit line patterns 80. The buried interlayer insulating layer 90 may be formed using an insulating layer having the same etch rate as that of the planarized interlayer insulating layer 60.

Figure 9:
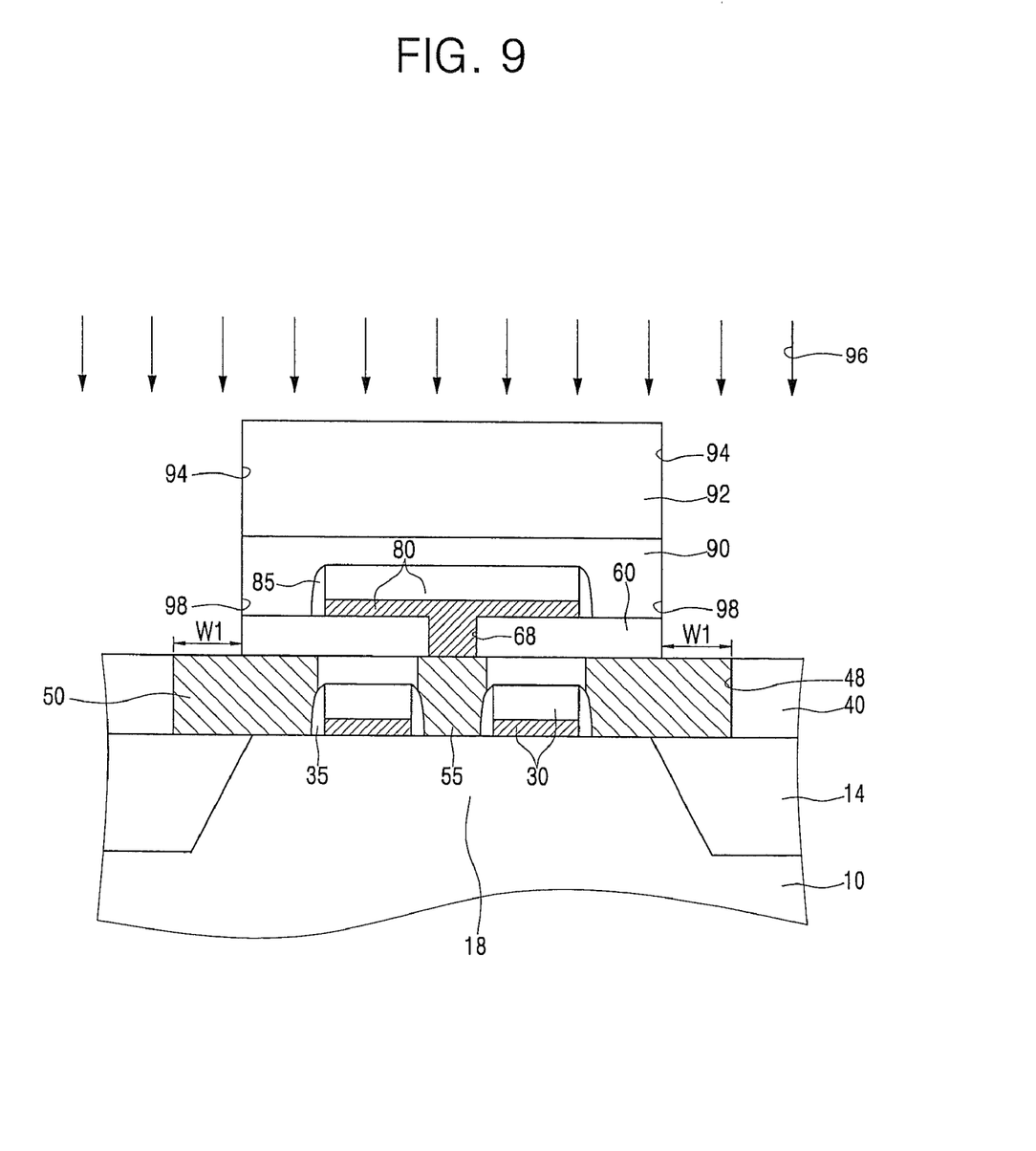
Figure 10:
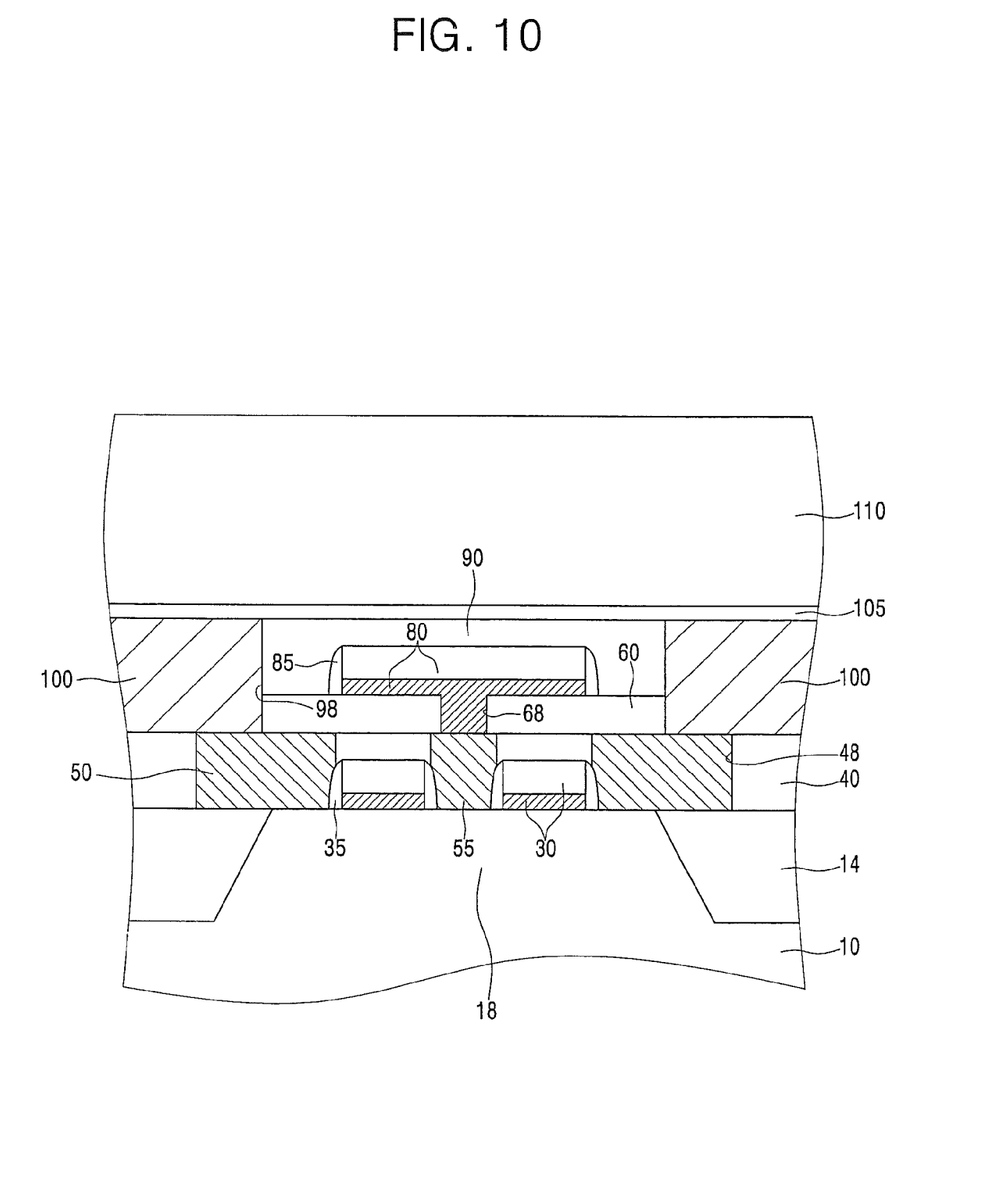

Referring to FIGS. 1, 9 and 10, a photoresist layer 92 is formed on the buried interlayer insulating layer 90. The photoresist layer 92 is formed to have openings 94 over the landing pads 50 of the peripheral portions of the active regions 18 respectively. The openings 94 of the photoresist layer 92 may have elliptical shapes. The openings 94 of the photoresist layer 92 may be formed to have minor axes and major axes in the longitudinal directions of the bit line patterns 80 and the gate patterns 30, respectively. To do so, each of the openings 94 of the photoresist layer 92 may be formed to have a predetermined diameter D4 in the longitudinal direction of the bit line patterns 80 and a predetermined diameter D5 in the longitudinal direction of the gate patterns 30.

An etch process 96 is sequentially performed on the buried interlayer insulating layer 90 and the planarized interlayer insulating layer 60 through the openings 94, using the photoresist layer 92 as an etch mask. The etch process 96 forms buried holes 98 sequentially penetrating the buried interlayer insulating layer 90 and the planarized interlayer insulating layer 60, and exposing the landing pads 50 and the pad interlayer insulating layer 40. The buried holes 98 may be formed to expose the landing pads 50 with a predetermined width W1 respectively. After the buried holes 98 are formed, the photoresist layer 92 may be removed from the semiconductor substrate 10.

Buried plugs 100 are formed to fill the buried holes 98 respectively. At this time, the upper surface of each of the buried plugs 100 is formed to have a predetermined diameter D4 in the longitudinal direction of the bit line patterns 80 and a predetermined diameter D5 in the longitudinal direction of the gate patterns 30 through the buried holes 98. Then, the buried plugs 100 and the landing pads 50 have different central axes through the buried holes 98, and cross with each other and overlap. The buried plugs 100 may be formed using, for example, conductive polysilicon. The conductive polysilicon may include N-type impurity ions.

An etch stop layer 105 and a molding layer 110 are sequentially formed on the buried interlayer insulating layer 90 to cover the buried plugs 100. The molding layer 110 may be formed using an insulating layer having the same etch rate as that of the buried interlayer insulating layer 90. The etch stop layer 105 may be formed using an insulating layer having the same etch rate as that of the bit line spacer 85.

Figure 11:
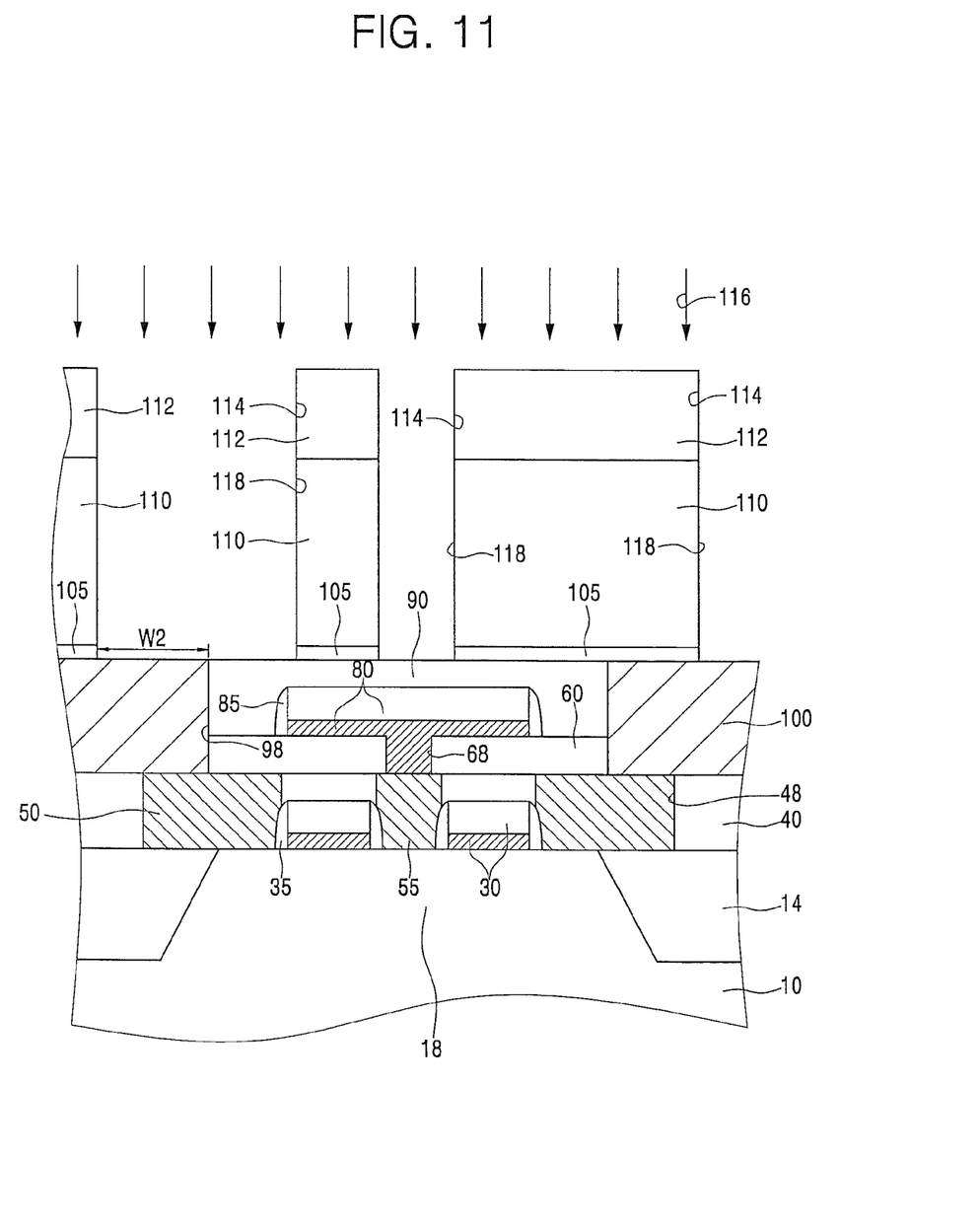
Figure 12:
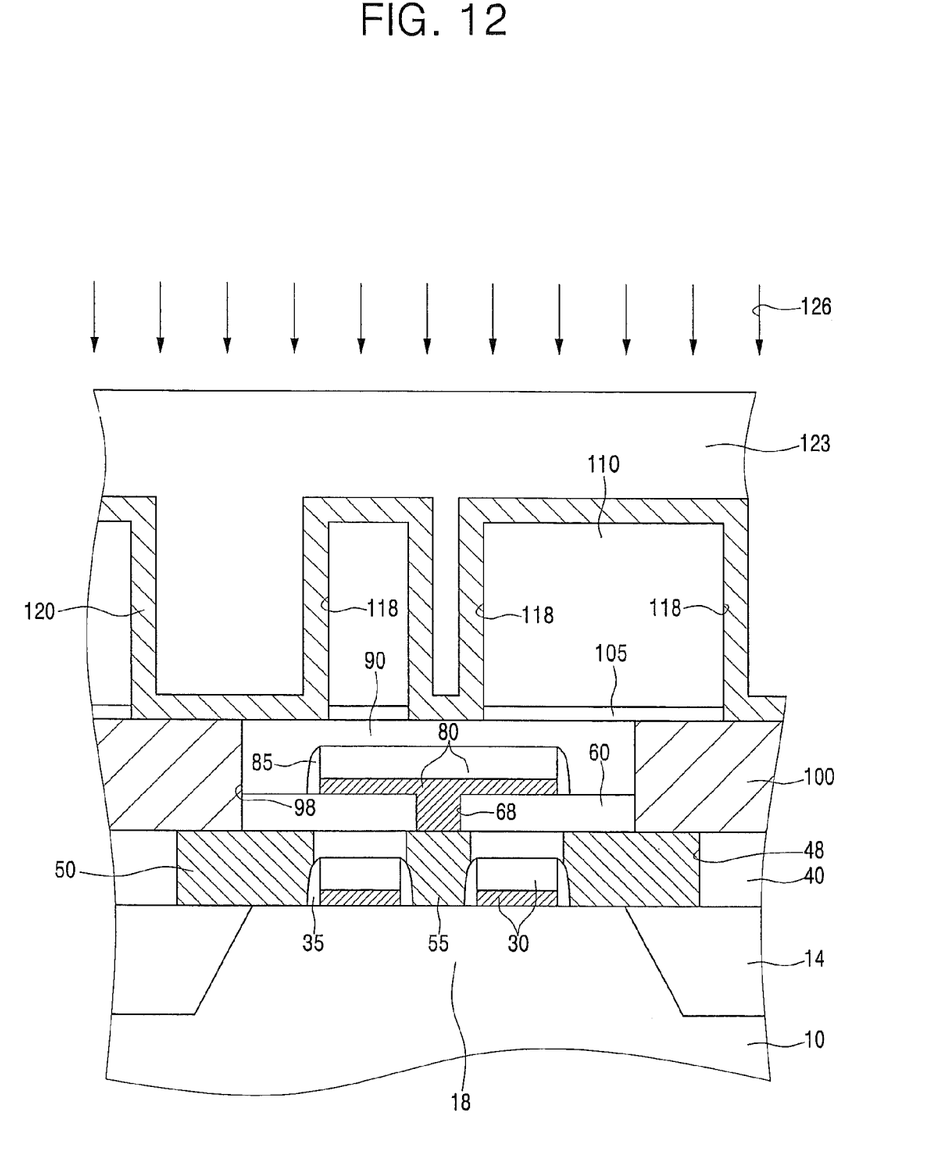
Figure 13:
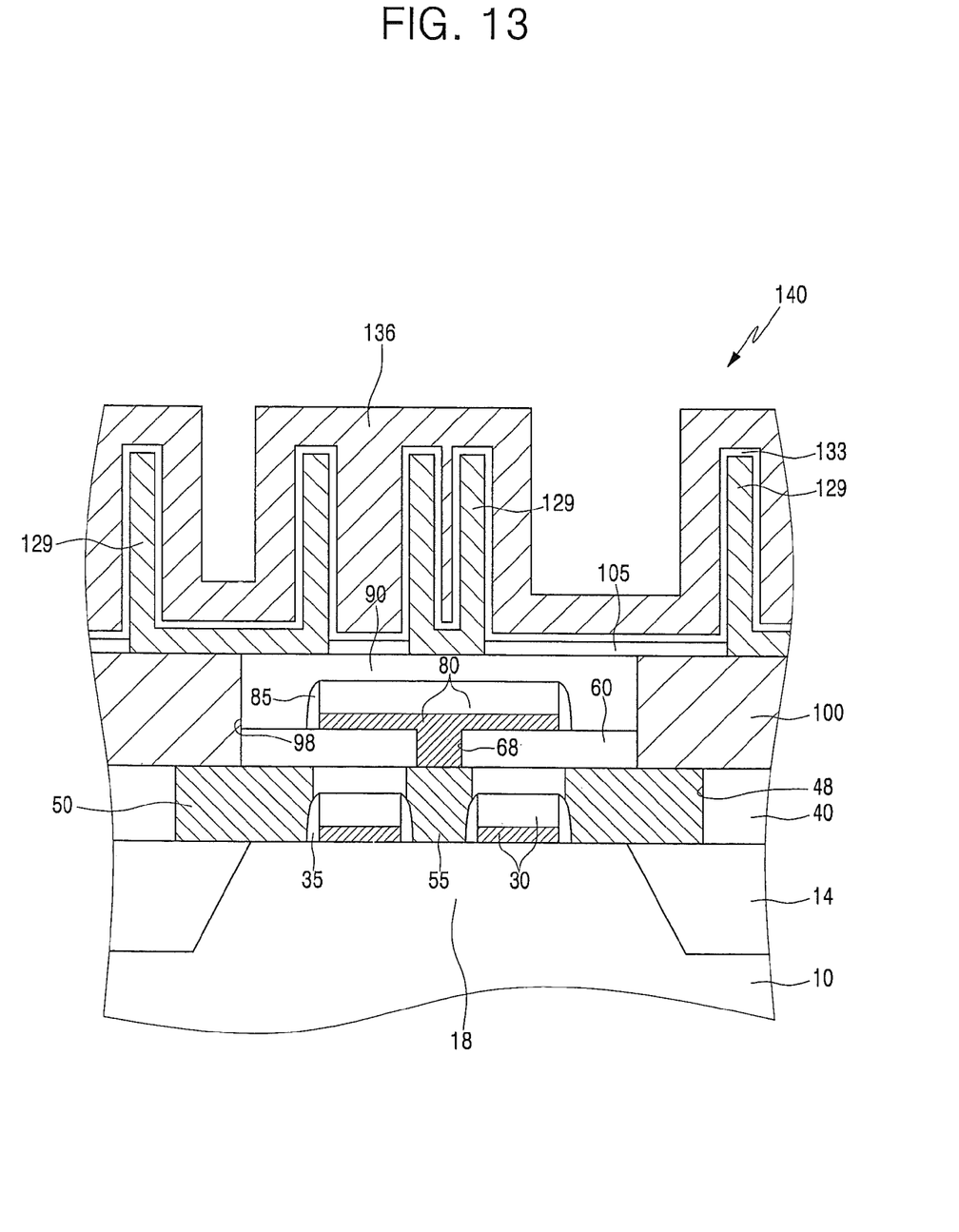

Referring to FIGS. 1, 11 and 13, a photoresist layer 112 is formed on the molding layer 110. The photoresist layer 112 is formed to have openings 114 at least partially above the buried plugs 100. The openings 114 of the photoresist layer 112 have elliptical shapes. The openings 114 of the photoresist layer 112 are formed to have minor axes and major axes in the longitudinal directions of the bit line patterns 80 and the gate patterns 30 respectively. To do this, each of the openings 114 of the photoresist layer 112 may be formed to have a predetermined diameter D6 in the longitudinal direction of the bit line patterns 80 and a predetermined diameter D7 in the longitudinal direction of the gate patterns 30.

An etch process 116 is sequentially performed on the molding layer 110 and the etch stop layer 105 through the openings 114, using the photoresist layer 112 as an etch mask. The etch process 116 forms lower electrode holes 118 sequentially penetrating the molding layer 110 and the etch stop layer 105, and exposing the buried plugs 100 and the buried interlayer insulating layer 90. The lower electrode holes 118 may be formed to overlap the buried plugs 100 respectively with a predetermined width W2. After the lower electrode holes 118 are formed, the photoresist layer 112 is removed from the semiconductor substrate 100.

A lower electrode layer 120 and a sacrificial layer 123 are sequentially formed on the molding layer 110 to conformally cover the lower electrode holes 118. The sacrificial layer 123 may be formed using an insulating layer having the same etch rate as that of the molding layer 110. The lower electrode layer 120 may be formed using a metal material including N-type polysilicon and/or titanium nitride (TiN).

A planarization process 126 is sequentially performed on the sacrificial layer 123 and the lower electrode layer 120 until the molding layer 110 is exposed. The planarization process 126 forms lower electrodes 129 between the molding layer 110 and the sacrificial layer 123. At this time, the upper surface of each of the lower electrodes 129 may be formed to have a predetermined diameter D6 in the longitudinal direction of the bit line patterns 80 and a predetermined diameter D7 in the longitudinal direction of the gate patterns 30 through the lower electrode holes 118. Further, the lower electrodes 129 and the buried plugs 100 may have different central axes through the lower electrode holes 118, and may cross with each other and overlap. Further, the lower electrodes 129 may be formed to sufficiently overlap a half of the landing pads 50 on the active regions 18. That is, the lower electrodes 129 may be formed to sufficiently overlap one landing pad 50 on one active region 18. Alternatively, the lower electrodes 129 may be formed to sufficiently overlap two landing pads 50 on two active regions 18. The lower electrodes 129 may be formed on the active regions 18 of the semiconductor substrate 10 such that the lower electrodes are spaced from each other by the same distances S1, S2, and S3, as shown in FIG. 1.

After the lower electrodes 129 are formed on the semiconductor substrate 10, the sacrificial layer 123 and the molding layer 110 are removed from the semiconductor substrate 10. A dielectric layer 133 and an upper electrode layer 136 are sequentially formed on the buried interlayer insulating layer 90 to cover the lower electrodes 129. The upper electrode layer 136 may be formed using N-type polysilicon and/or a metal material including titanium nitride (TiN). The dielectric layer 133 may be formed using aluminum oxide ($Al_2O_3$) and/or titanium nitride (TiN), which are sequentially stacked. Further, the dielectric layer 133 may be formed using hafnium oxide (HfO), aluminum oxide ($Al_2O_3$), and/or titanium nitride (TiN). Thus, two capacitors 140 including the landing pads 50, the buried plugs 100, and the lower electrodes 129 on one active region 18 of the semiconductor substrate 10 can be formed.

As described above, some embodiments of the present invention may provide ways of effectively placing lower electrodes inside predetermined regions on a semiconductor substrate using a submicron design rule. Therefore, the lower electrodes can improve the electrical characteristics of capacitors of a DRAM semiconductor memory cell.

While embodiments of the invention have been described in connection with DRAM semiconductor memory devices, it will be apparent that embodiments of the invention may include other types of semiconductor memory devices, and that the invention is not limited to capacitors for DRAM devices.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of forming a capacitor of a semiconductor memory device, comprising:
    forming a pad interlayer insulating layer on an active region of a semiconductor substrate;
    forming landing pads and a central landing pad in peripheral portions and a central portion of the active region respectively to penetrate the pad interlayer insulating layer;
    forming a planarized interlayer insulating layer and a buried interlayer insulating layer on the pad interlayer insulating layer to cover the landing pads and the central landing pad;
    forming buried plugs on the landing pads to sequentially penetrate the buried interlayer insulating layer and the planarized interlayer insulating layer, wherein the buried plugs have an elliptical shape to be elongated in a gate patterns extending direction; and
    forming lower electrodes on the buried plugs.

2. The method according to claim 1, wherein each of the buried plugs has an overlapping area, partially overlapping with each of the landing pads.

3. The method according to claim 2, wherein ones of the buried plugs are elongated in a first direction from the overlapping area, and other ones of the buried plugs are elongated in a second direction opposite the first direction from the overlapping area.

4. The method according to claim 1, wherein areas of upper surfaces of the landing pads are greater than an upper surface of the central landing pad.

5. The method according to claim 1, wherein ones of the lower electrodes and the landing pads fully overlap each other, and other ones of the lower electrodes and the landing pads partially overlap each other.

6. A method of forming a capacitor of a semiconductor memory device, comprising:
    forming a pad interlayer insulating layer on an active region of a semiconductor substrate;
    forming landing pads and a central landing pad in peripheral portions and a central portion of the active region respectively to penetrate the pad interlayer insulating layer, an upper surface of the central landing pad having an area different from areas of upper surfaces of the landing pads;
    sequentially forming a planarized interlayer insulating layer and a buried interlayer insulating layer on the pad interlayer insulating layer to cover the landing pads and the central landing pad;
    respectively forming buried plugs on the landing pads to sequentially penetrate the buried interlayer insulating layer and the planarized interlayer insulating layer, wherein the buried plugs have an elliptical shape to be elongated in a gate patterns extending direction; and
    forming lower electrodes on the buried plugs respectively, wherein the lower electrodes and the buried plugs include respective central axes that are spaced apart from central axes of the landing pads, respective ones of the lower electrodes and the buried plugs overlap each other, and each of the lower electrodes overlaps one of the landing pads;
    wherein the forming the lower electrodes comprises:
    forming an etch stop layer and a molding layer on the buried interlayer insulating layer;
    forming a photoresist layer having openings on the molding layer, the openings of the photoresist layer having an elliptical shape; and
    performing an etch process on the molding layer and the etch stop layer through the openings sequentially, using the photoresist layer as an etch mask, thereby forming lower electrode holes having an elliptical shape, wherein the lower electrode holes are formed to expose the buried plugs respectively.

7. The method according to claim 1, further comprising:
    removing the photoresist layer from the semiconductor substrate;
    sequentially forming a lower electrode layer and a sacrificial layer on the molding layer to conformally cover the lower electrode holes; and
    performing a planarization process on the sacrificial layer and the lower electrode layer sequentially until the molding layer is exposed.

8. The method according to claim 1, wherein the forming the buried plugs comprises:
    forming a photoresist layer having openings on the buried interlayer insulating layer, the openings of the photoresist layer having an elliptical shape;
    sequentially performing an etch process on the buried interlayer insulating layer and the planarized interlayer insulating layer through the openings, using the photoresist layer as an etch mask, thereby forming buried holes;
    removing the photoresist layer from the semiconductor substrate; and
    forming conductive polysilicon within the buried holes, wherein the buried holes expose the landing pads.

9. The method according to claim 1, wherein the forming the landing pads and the central landing pad comprises:
    forming a photoresist layer having openings on the pad interlayer insulating layer, the openings of the photoresist layer having a circular shape;
    performing an etch process on the pad interlayer insulating layer through the openings, using the photoresist layer as an etch mask, thereby forming pad holes;
    removing the photoresist layer from the semiconductor substrate; and forming conductive polysilicon to fill the pad holes, wherein
    the pad holes are formed to expose the semiconductor substrate.

10. The method according to claim 1, further comprising:
    forming gate patterns and a bit line pattern to run across the active region, wherein the gate patterns are formed between the landing pads and the central landing pad so as to be covered with the pad interlayer insulating layer, the bit line pattern is formed in a direction perpendicular to the gate patterns so as to contact the central landing pad, and the bit line patterns are formed near the buried plugs below the lower electrodes so as to be covered with the planarized interlayer insulating layer and the buried interlayer insulating layer.

11. The method according to claim 10, wherein the bit line pattern is formed to have dummy patterns on the central landing pad.

12. A method of forming a capacitor of a semiconductor memory device, comprising:

forming a pad interlayer insulating layer on a semiconductor substrate having at least two active regions disposed therein;

forming landing pads and central landing pads respectively in peripheral portions and central portions of the active regions to penetrate the pad interlayer insulating layer, upper surfaces of the central landing pads having areas different from areas of upper surfaces of the landing pads;

forming a planarized interlayer insulating layer and a buried interlayer insulating layer sequentially on the pad interlayer insulating layer to cover the landing pads and the central landing pads;

sequentially forming buried plugs on the landing pads to penetrate the buried interlayer insulating layer and the planarized interlayer insulating layer, wherein the buried plugs have an elliptical shape to be elongated in a gate patterns extending direction; and forming lower electrodes on the buried plugs respectively, wherein the lower electrodes and the buried plugs are spaced from the central axes of the landing pads and overlap each other, and each of the lower electrodes overlaps one of the landing pads;

wherein the forming the lower electrodes comprises:

forming an etch stop layer and a molding layer on the buried interlayer insulating layer;

forming a photoresist layer having openings on the molding layer, the openings of the photoresist layer having an elliptical shape; and performing an etch process on the molding layer and the etch stop layer through the openings sequentially, using the photoresist layer as an etch mask, thereby forming lower electrode holes having an elliptical shape, wherein the lower electrode holes are formed to expose the buried plugs respectively.

13. The method according to claim 12, wherein the neighboring electrodes are spaced apart from one another by a same distance.

14. The method according to claim 12, further comprising:
removing the photoresist layer from the semiconductor substrate;
sequentially forming a lower electrode layer and a sacrificial layer on the molding layer to conformally cover the lower electrode holes; and
sequentially performing a planarization process on the sacrificial layer and the lower electrode layer until the molding layer is exposed.

15. The method according to claim 12, wherein the forming the buried plugs comprises:

forming a photoresist layer having openings on the buried interlayer insulating layer, the openings of the photoresist layer having an elliptical shape;

sequentially performing an etch process on the buried interlayer insulating layer and the planarized interlayer insulating layer through the openings, using the photoresist layer as an etch mask, thereby forming buried holes;

removing the photoresist layer from the semiconductor substrate; and forming conductive polysilicon to fill the buried holes, wherein the buried holes are formed to expose the landing pads.

16. The method according to claim 12, wherein the forming the landing pads and the central landing pad comprises:

forming a photoresist layer having openings on the pad interlayer insulating layer, the openings of the photoresist layer having a circular shape;

performing an etch process on the pad interlayer insulating layer through the openings, using the photoresist layer as an etch mask, thereby forming pad holes;

removing the photoresist layer from the semiconductor substrate; and forming conductive polysilicon to fill the pad holes, wherein the pad holes are formed to expose the semiconductor substrate.

17. The method according to claim 12, further comprising the forming gate patterns and bit line patterns to run across the active region, wherein the gate patterns are formed between the landing pads and the central landing pads so as to be covered with the pad interlayer insulating layer, the bit line patterns are formed in a direction perpendicular to the gate patterns so as to contact with the central landing pads, and the bit line patterns are formed between the buried plugs below the lower electrodes so as to be covered with the planarized interlayer insulating layer and the buried interlayer insulating layer.

18. The method according to claim 17, wherein the bit line patterns are formed to have dummy patterns on the central landing pads.

19. The method according to claim 12, wherein a layout of one of the active regions is rotated 180 degrees to become a layout of a neighboring active region displaced in the longitudinal direction from the active region.

20. The method according to claim 17, wherein a layout pattern of one of the active regions is rotated 180 degrees and shifted in parallel with the bit line pattern as much as a width of the one active region to define a layout pattern of a neighboring active region.

* * * * *